(12) United States Patent
Lee

(10) Patent No.: US 11,699,658 B2
(45) Date of Patent: Jul. 11, 2023

(54) SEMICONDUCTOR DEVICE WITH METAL INTERCONNECTION

(71) Applicant: SK hynix Inc., Gyeonggi-do (KR)

(72) Inventor: Eunsung Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 215 days.

(21) Appl. No.: 16/889,467

(22) Filed: Jun. 1, 2020

(65) Prior Publication Data

US 2021/0202383 A1 Jul. 1, 2021

(30) Foreign Application Priority Data

Dec. 30, 2019 (KR) .................. 10-2019-0178435

(51) Int. Cl.
| | | |
|---|---|---|
| *H01F 5/00* | (2006.01) | |
| *H01L 23/528* | (2006.01) | |
| *H01L 23/522* | (2006.01) | |
| *H01L 21/66* | (2006.01) | |

(52) U.S. Cl.
CPC .......... *H01L 23/5283* (2013.01); *H01L 22/34* (2013.01); *H01L 23/5226* (2013.01)

(58) Field of Classification Search
CPC . H01L 23/5227; H01L 23/5226; H01L 28/10; H01L 23/645
See application file for complete search history.

(56) References Cited

U.S. PATENT DOCUMENTS

| | | | | |
|---|---|---|---|---|
| 5,828,096 A | * | 10/1998 | Ohno | ............. H01L 23/5226 257/306 |
| 5,936,299 A | * | 8/1999 | Burghartz | ............ H01L 28/10 257/422 |
| 8,193,824 B2 | | 6/2012 | Weng et al. | |
| 8,779,594 B2 | * | 7/2014 | Inoue | ................. H01L 23/522 257/758 |
| 9,673,504 B2 | * | 6/2017 | Meharry | ................ H01P 9/006 |
| 9,704,855 B2 | * | 7/2017 | Xu | .................... H01L 29/66659 |
| 2004/0195652 A1 | * | 10/2004 | Okada | .............. H01L 23/5227 257/E21.022 |
| 2005/0073025 A1 | * | 4/2005 | Hashizume | ........ H01L 23/5227 257/531 |
| 2005/0133924 A1 | * | 6/2005 | Crawford | ............ H01L 23/552 257/E21.022 |
| 2006/0022787 A1 | * | 2/2006 | Brennan | ............ H01F 17/0006 336/200 |
| 2006/0097836 A1 | * | 5/2006 | Sakamoto | ............... H01L 27/08 336/200 |
| 2006/0151851 A1 | * | 7/2006 | Pillai | .................. H01L 23/5227 257/536 |
| 2009/0020756 A1 | | 1/2009 | Lee | |
| 2013/0034971 A1 | * | 2/2013 | Tsai | .................... H01L 23/5226 439/55 |
| 2013/0153888 A1 | * | 6/2013 | Inoue | ............... H01L 29/66477 257/43 |
| 2016/0260705 A1 | * | 9/2016 | Ikimura | ............ H01L 27/0288 |

* cited by examiner

*Primary Examiner* — Anthony Ho
*Assistant Examiner* — David J Goodwin
(74) *Attorney, Agent, or Firm* — IP & T Group LLP

(57) ABSTRACT

A semiconductor device includes: a substrate; a test transistor over the substrate; and multi-level metal interconnections formed over the substrate spaced apart from the test transistor, wherein at least one metal interconnection among the multi-level metal interconnections is a spiral metal interconnection.

14 Claims, 31 Drawing Sheets

SEMICONDUCTOR DEVICE WITH METAL INTERCONNECTION

CROSS-REFERENCE TO RELATED APPLICATIONS

The present application claims priority to Korean Patent Application No. 10-2019-0178435, filed on Dec. 30, 2019, which is incorporated herein by reference in its entirety.

BACKGROUND

1. Field

Various embodiments of the present invention relate to a semiconductor device and, more particularly, to a semiconductor device including a metal interconnection with a spiral structure.

2. Description of the Related Art

A process of using plasma (which is, hereinafter, referred to as a plasma process) is used in many processes for the fabrication of a semiconductor device. The plasma process is mainly used to deposit or etch various material layers. However, various structures of a semiconductor device may be damaged by the plasma process which may deteriorate the characteristics of the device.

SUMMARY

Various embodiments of the present invention are directed to a semiconductor device with improved characteristics including reliability. The present invention may alleviate any plasma-induced damage resulting in an improved semiconductor device.

In accordance with an embodiment of the present invention, a semiconductor device includes: a substrate; a test transistor over the substrate; and multi-level metal interconnections formed over the substrate spaced apart from the test transistor, wherein at least one metal interconnection among the multi-level metal interconnections is a spiral metal interconnection.

In accordance with another embodiment of the present invention, a semiconductor device includes: multi-level metal interconnections over a substrate; and a pad formed over the multi-level metal interconnections, wherein at least one metal interconnection among the multi-level metal interconnections is a spiral metal interconnection.

In accordance with yet another embodiment of the present invention, a semiconductor device includes: a substrate including a cell region and a peripheral region; multi-level cell metal interconnections formed over the substrate of the cell region, and multi-level peripheral metal interconnections formed over the substrate of the peripheral region; and a cell pad formed over the multi-level cell metal interconnections, and a peripheral pad formed over the multi-level peripheral metal interconnections, wherein at least one metal interconnection among the multi-level cell metal interconnections and the peripheral metal interconnections is a spiral metal interconnection.

DETAILED DESCRIPTION

Figure 1A:
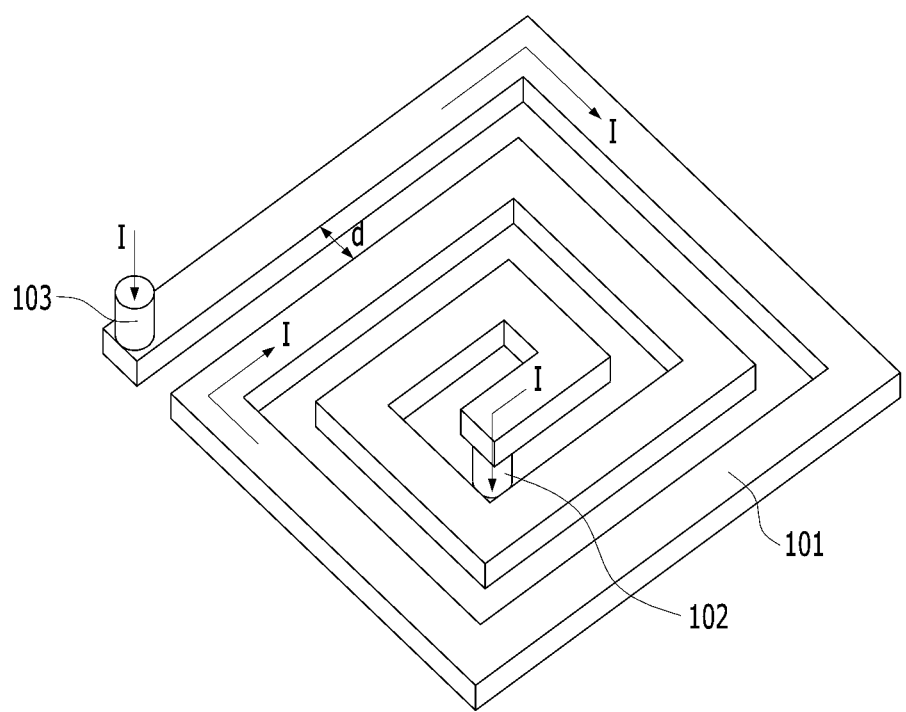
FIGS. 1A and 1B are perspective views illustrating a metal interconnection in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Plasma-Induced Damage (PID) is mainly caused by the ion charging of wafers, and there also may be nonuniformity according to the position of plasma depending on the environment of equipment itself and the plasma conditions. The nonuniformity in the plasma-induced damage may also cause nonuniformity in charging density.

The deposition and etching processes using plasma may be mostly performed on the surface of a non-conductive material, for example, a dielectric material such as silicon oxide ($SiO_2$). When charging density becomes not uniform while the processes are being performed, current may be generated from a higher charging density to a lower charging density in order to eliminate the charging density.

This current flows through a device inside a wafer, for example, a gate dielectric layer, causing electrical stress on the semiconductor device and causing plasma-induced damage (PID) such as electron traps and leakage current paths inside a gate dielectric layer.

In particular, when electrons are accumulated on a metal interconnection to form a particular pattern during an etching process using plasma, that is, when the metal interconnection floats during the plasma process, the accumulated electrons flow into a neighboring metal interconnection or contact.

Therefore, according to an embodiment of the present invention, the plasma-induced damage may be alleviated by forming the metal interconnection in a spiral structure and thus generating an electric potential having an opposite direction to the direction of the electric potential caused by the charging occurrences when a wiring process (for example, a contact etching process, a pad open etching process, a line etching process, or a damascene process) is performed.

Figure 1B:
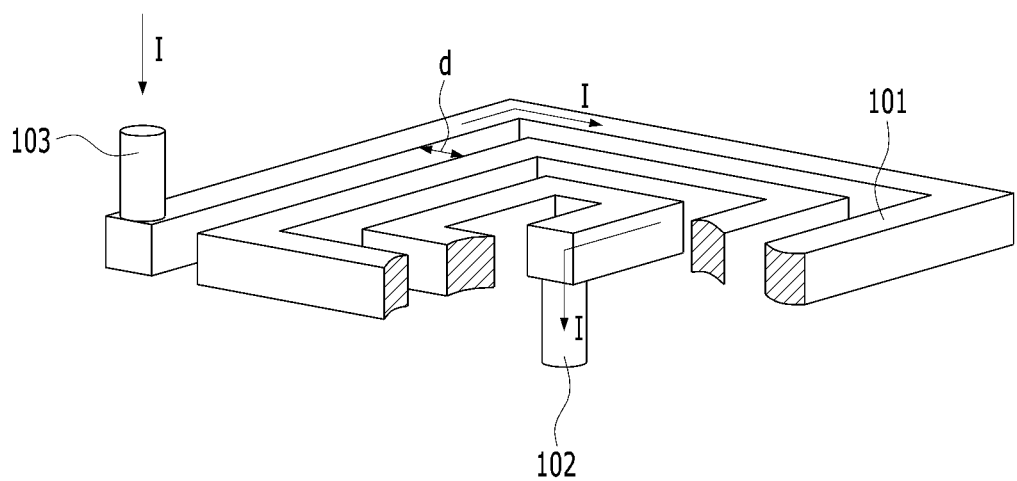

FIGS. 1A and 1B are perspective views illustrating a metal interconnection in accordance with an embodiment of the present invention. FIG. 1B is a detailed view of FIG. 1A. FIGS. 2A to 2D are perspective views illustrating metal interconnections in accordance with other embodiments of the present invention. Referring to FIGS. 1A and 1B and FIGS. 2A to 2D, the same reference numerals are used, and each reference numeral may designate the same element.

Referring to FIGS. 1A and 1B, and 2A to 2D, the metal interconnection 101 may be formed in a spiral structure creating a current flow that offsets plasma-induced damage. The spiral structure may be extending horizontally between a top surface extending along a top horizontal plane and a bottom surface extending along a bottom horizontal plane. An upward contact 103 may be coupled to a first end of a metal interconnection 101, and a downward contact 102 may be coupled to a second end of the metal interconnection 101. The upward contact 103 may be extending above the top horizontal plane of the metal interconnection spiral. The downward contact 102 may be extending below the bottom horizontal plane of the metal interconnection spiral.

The first end of the metal interconnection 101 may be the end positioned at the outer of the spiral metal interconnection. The second end of the metal interconnection 101 may be the end positioned inner the spiral metal interconnection. The second end of the metal interconnection 101 may be positioned at a center region of the spiral structure. The upward contact 103 and the downward contact 102 may be positioned spaced apart from each other in the horizontal direction by a predetermined distance. The upward contact 103 and the downward contact 102 may not overlap with each other both in the horizontal and the vertical direction. In an embodiment, the upward contact 103 and the downward contact 102 may not overlap with each other in the vertical direction only. In an embodiment, the upward contact 103 and the downward contact 102 may not overlap with each other in the horizontal direction only.

Current I may flow from the upward contact 103 to the metal interconnection 101 and from the spiral metal interconnection 101 to the downward contact 102. As the current I moves along the spiral structure of the metal interconnection 101, an electric potential may be generated in a direction opposite to that of the electric potential caused by the charging induced during the plasma process, resulting in mitigating a plasma-induced damage (PID).

The upward contact 103 and the downward contact 102 may be made of or include a silicon-containing material or a metal-containing material. For example, the upward contact 103 and the downward contact 102 may be made of or include polysilicon, a metal, a metal nitride, a metal silicide or a combination thereof.

Figure 2A:
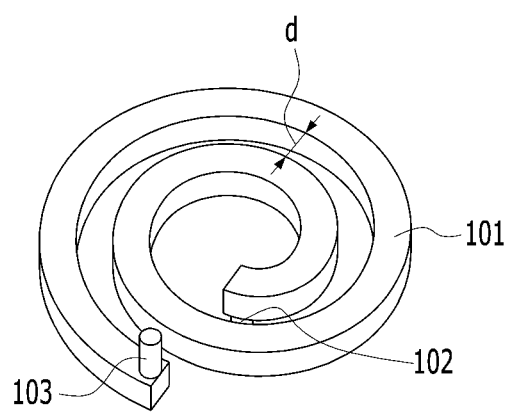
FIGS. 2A to 2D are perspective views illustrating metal interconnections in accordance with other embodiments of the present invention.
Figure 2B:
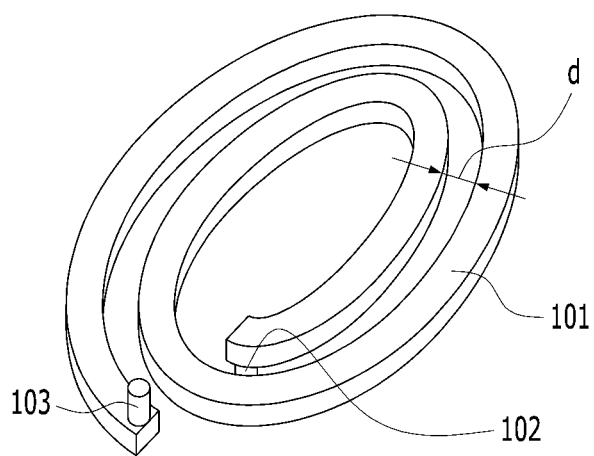
Figure 2C:
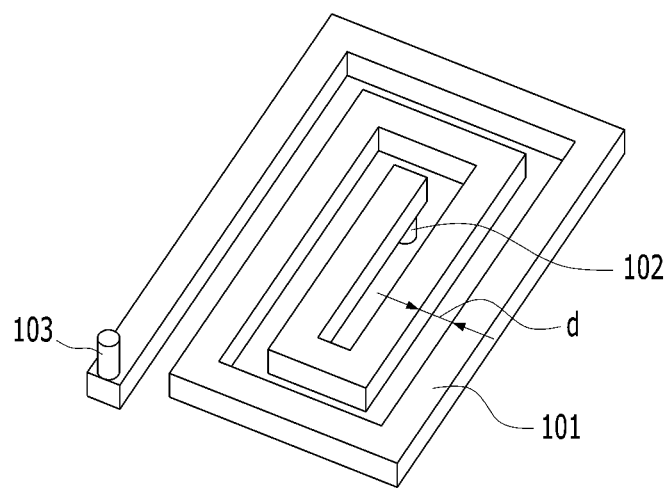
Figure 2D:
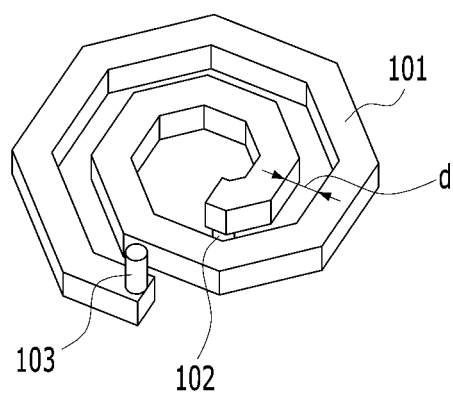

Examples of suitable materials for the metal interconnection 101 may be or include a suitable metal, such as, for example, tungsten, copper, aluminum, or combinations thereof. The metal interconnection 101 may have a square spiral structure as shown in FIGS. 1A and 1B wherein the spiral consists of line segments that form 90-degree angles as the spiral spirals around the starting point of the spiral (referred to herein also as the second end of the spiral metal interconnection 101). The shape of the spiral metal interconnection 101 as shown in FIGS. 1A and 1B may be a square or a rectangle. According to another embodiment of the present invention, the metal interconnection 101 may have a spiral structure of a round shape as shown in FIGS. 2A and 2B. The shape of the metal interconnection 101 may be a circular spiral structure as shown in FIG. 2A, or an elliptical spiral structure as shown in FIG. 2B. According to another embodiment of the present invention, the metal interconnection 101 may have a polygonal spiral structure having a bend shape as shown in FIGS. 2C and 2D. The metal interconnection 101 may include a square spiral structure as shown in FIGS. 1A and 1B, a rectangular spiral structure as shown in FIG. 2C, or an octagonal spiral structure as shown in FIG. 2D. Additionally, it may include all polygonal spiral structures.

The distance d between the lines of the metal interconnection 101 forming the spiral structure over the same plane may range from approximately 1 nm to approximately $1 \times 10^5$ nm. The number N of the spirals (the number of the 360-degree spiral turns) which are spirally wound may range from approximately 1 to approximately 10000. The thickness of the metal interconnection 101 may include a thickness of approximately 1 Å to approximately $1 \times 10^9$ Å. In an embodiment, the metal interconnection 101 of the spiral structure may be applied to a test pattern for measuring plasma-induced damage. In another embodiment, the metal interconnection 101 of the spiral structure may be applied to a cell region for device operation.

Figure 3:
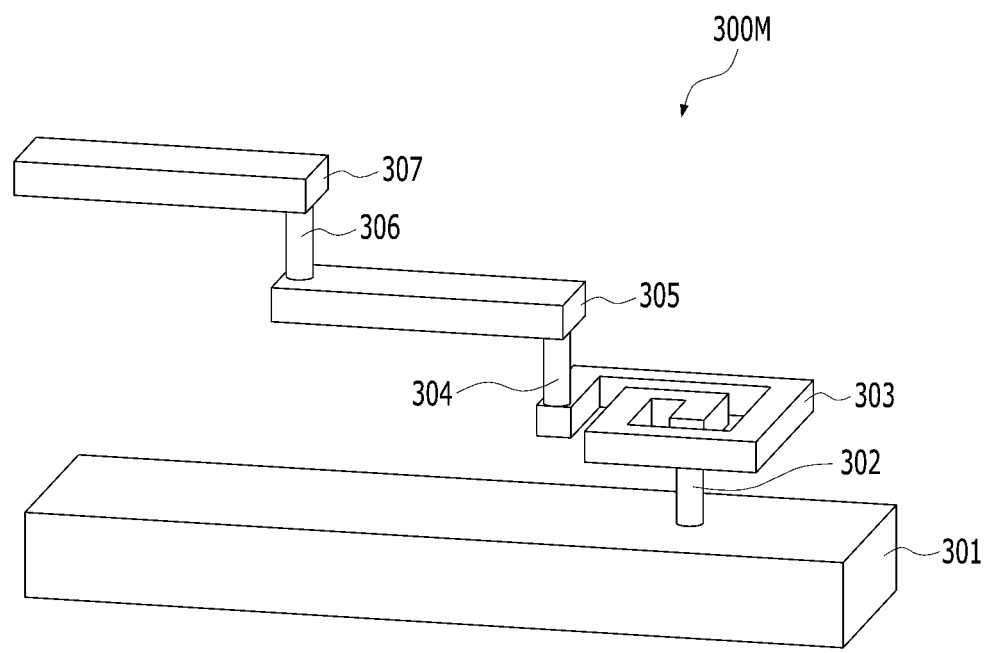
FIG. 3 is a perspective view illustrating multi-level metal interconnections in accordance with an embodiment of the present invention.

FIG. 3 is a perspective view illustrating multi-level metal interconnections in accordance with an embodiment of the present invention.

Referring to FIG. 3, the semiconductor device may include multi-level metal interconnections 300M in which a first metal interconnection 303, a second metal interconnection 305, and a third metal interconnection 307 are positioned over a substrate 301 at different levels from the substrate.

The semiconductor device may be a spiral metal interconnection including a spiral structure when viewed from the top such that at least one among the multi-level metal interconnections 300M has a current flow that offsets the plasma-induced damage caused from other metal interconnections or pads. The metal interconnections 303, 305, and 307 may be coupled to the upper and lower layers by the first to third contacts 302, 304, and 306, respectively.

According to an embodiment of the present invention, the multi-level metal interconnections 300M may have the first to third metal interconnections 303, 305, and 307 as shown in FIG. 3, but the concept and spirit of the present invention are not limited thereto. The multi-level metal interconnections 300M may include a single-layer metal interconnection including an upper structure, or multi-level metal interconnections of at least two layers or more.

In the semiconductor device, at least one metal interconnection, e.g., the first metal interconnection 303 (which is the lowest layer in the embodiment of FIG. 3) may be formed in a spiral structure. According to another embodiment of the present invention, at least one among the first metal interconnection 303 to the third metal interconnection 307 of the semiconductor device may be formed in a spiral structure. According to another embodiment of the present invention, all of the first metal interconnection 303 to the third metal interconnection 307 of the semiconductor device may be formed in a spiral structure.

The first to third metal interconnections 303, 305, and 307 may be or include a suitable metal, such as, for example, tungsten, copper, aluminum, or any combination thereof. The metal interconnection which may include a spiral structure among the first to third metal interconnections 303, 305, and 307 may be a spiral structure having a round shape, such as a circular shape or an ellipse shape. According to another embodiment of the present invention, the metal interconnection with a spiral structure among the first to third metal interconnections 303, 305, and 307 may be a spiral structure having a shape selected from one among various polygons including a square, a rectangle, an octagon, and the like.

The distance between the lines of the metal interconnection having a spiral structure among the first to third metal interconnections 303, 305, and 307 may range from approximately 1 nm to approximately 1×105 nm. Also, the number N of the spirals wound may range from approximately 1 to approximately 10000. The thickness of each of the first to third metal interconnections 303, 305, and 307 may have a thickness of approximately 1 Å to approximately $1 \times 10^9$ Å. The first to third metal interconnections 303, 305, and 307 including metal interconnections of a spiral structure may be applied, for example, to a test pattern for measuring plasma-induced damage or a cell region for device operation.

The first to third contacts 302, 304, and 306 are in contact with the first to third metal interconnections 303, 305, and 307, respectively. The second contact 304 is in contact with the outer end of the first metal interconnection 303 and the inner end of the second metal interconnection 305. The third contact 306 is in contact with the outer end of the second metal interconnection 305 and the inner end of the third metal interconnection 307. Stated otherwise, the upward contact of each metal interconnection may contact the outer end of the metal interconnection and the inner end of the immediate upper metal interconnection, if there is one. The downward contact of each metal interconnection may contact the inner end the outer contact of an immediate lower metal interconnection, if there is one. The first to third contacts 302, 304, and 306 may be spaced apart from each other by a predetermined distance in the horizontal direction. The first to third contacts 302, 304, and 306 may not overlap with each other.

For example, since the first contact 302 coupling the first metal interconnection 303 and the substrate 301 corresponds to a downward contact of the first metal interconnection 303, it may be coupled to an inner end of the first metal interconnection 303. Since the second contact 304 coupling the first metal interconnection 303 and the second metal interconnection 305 corresponds to an upward contact of the first metal interconnection 303 and corresponds to a downward contact of the second metal interconnection 305, the second contact 304 may be coupled to an outer end of the first metal interconnection 303 and coupled to an inner end of the second metal interconnection 305. The third contact 306 coupling the second metal interconnection 305 and the third metal interconnection 307 corresponds to an upward contact of the second metal interconnection 305 and to a downward contact of the third metal interconnection 307, the third contact 306 may be coupled to an outer end of the second metal interconnection 305 and coupled to an inner end of the third metal interconnection 307.

The first to third contacts 302, 304, and 306 may be made of or include a silicon-containing material or a metal-containing material. For example, the first to third contacts 302, 304, and 306 may be made of or include polysilicon, a metal, a metal nitride, a metal silicide, or a combination thereof.

Figure 4A:
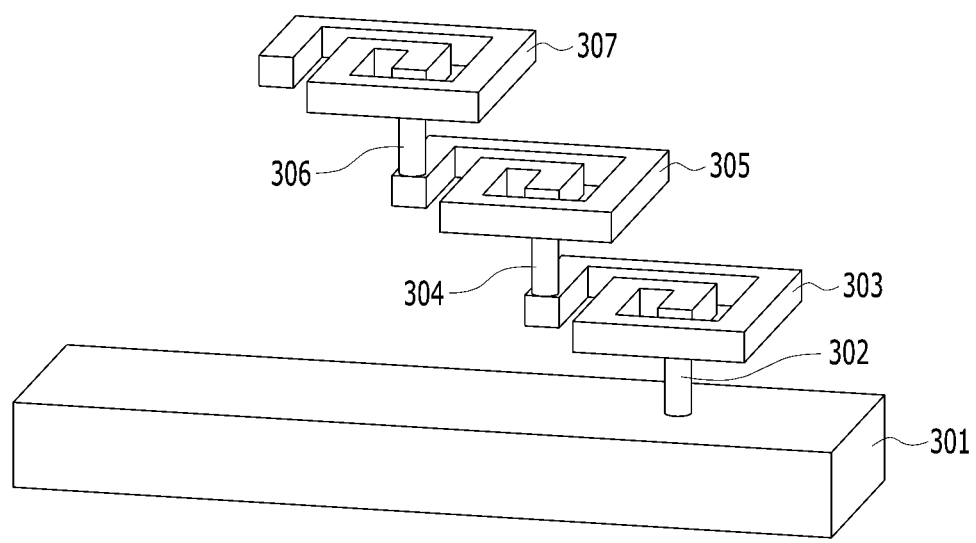
FIGS. 4A to 4C are perspective views illustrating multi-level metal interconnections in accordance with an embodiment of the present invention.
Figure 4B:
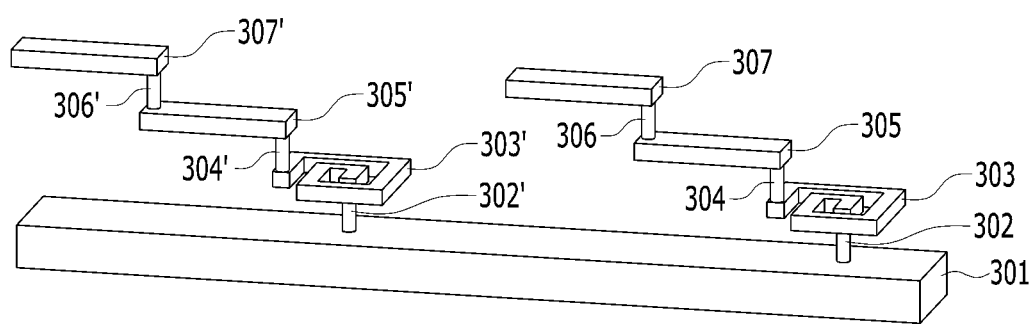
Figure 4C:
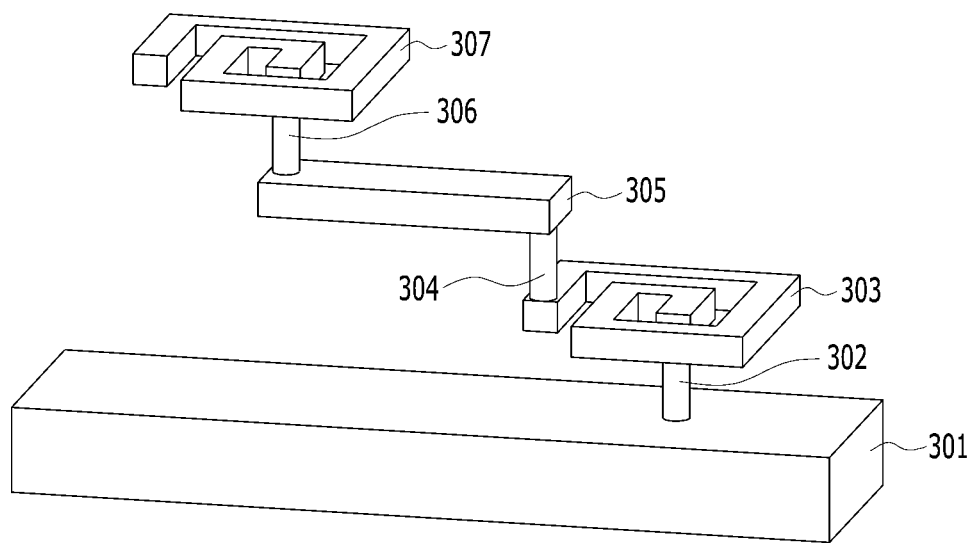

FIGS. 4A to 4C are perspective views illustrating multi-level metal interconnections in accordance with an embodiment of the present invention. The same reference numerals appear throughout FIGS. 4A to 4C and the same reference numerals represent the same constituent elements.

Referring to FIG. 4A, the first to third metal interconnections 303, 305, and 307 may each be formed in a spiral structure and may be connected in series. This structure may be referred to as a serially continuous spiral structure. In a serially continuous structure at least two of the first to third metal interconnections 303, 305, and 307 which are adjacent to each other may have a spiral structure. In the embodiment of FIG. 4A, each of the metal interconnections 303, 305, and 307 may have a spiral structure. Each of the metal interconnections 303, 305, and 307 may be coupled to an upper and/or lower structure or layer by the first to third contacts 302, 304, and 306.

The first contact 302 may be in contact with the first metal interconnection 303. The second contact 304 may be in contact with the first and second metal interconnections 303, 305 and the third contact 306 may be in contact with the second and third metal interconnections 305, 307. An upward contact of a metal interconnection may contact the outer end of the metal interconnection, and a downward contact may contact the inner end of the metal interconnection. The first to third contacts 302, 304, and 306 may be positioned spaced apart from each other by a predetermined distance in the horizontal direction and may overlap with each other.

Referring to FIG. 4B, neighboring metal interconnections on the same plane may be formed to have spiral structures that are continuously parallel to each other. In other words, neighboring first metal interconnections 303 and 303' may be formed to each have spiral structures. According to the described embodiment of FIG. 4B, only the neighboring first metal interconnections 303 and 303' are illustrated to have spiral structures, but the concept and spirit of the described embodiment are not limited thereto, and neighboring second metal interconnections 305 and 305' and/or neighboring third metal interconnections 307 and 307' may also be formed to have spiral structures that are continuously parallel. Each of the metal interconnections 303, 305, 307, 303', 305', and 307' may be coupled to their respective upper and lower structures/layers by the corresponding first to third contacts 302, 304, 306, 302', 304', and 306'.

Referring to FIG. 4C, the first and third metal interconnections 303 and 307 may be formed in a spiral structure, and the second metal interconnection 305 may be formed as a line type. In other words, the spiral structures of the first to third metal interconnections 303, 305, and 307 may be formed discontinuously.

Figure 5:
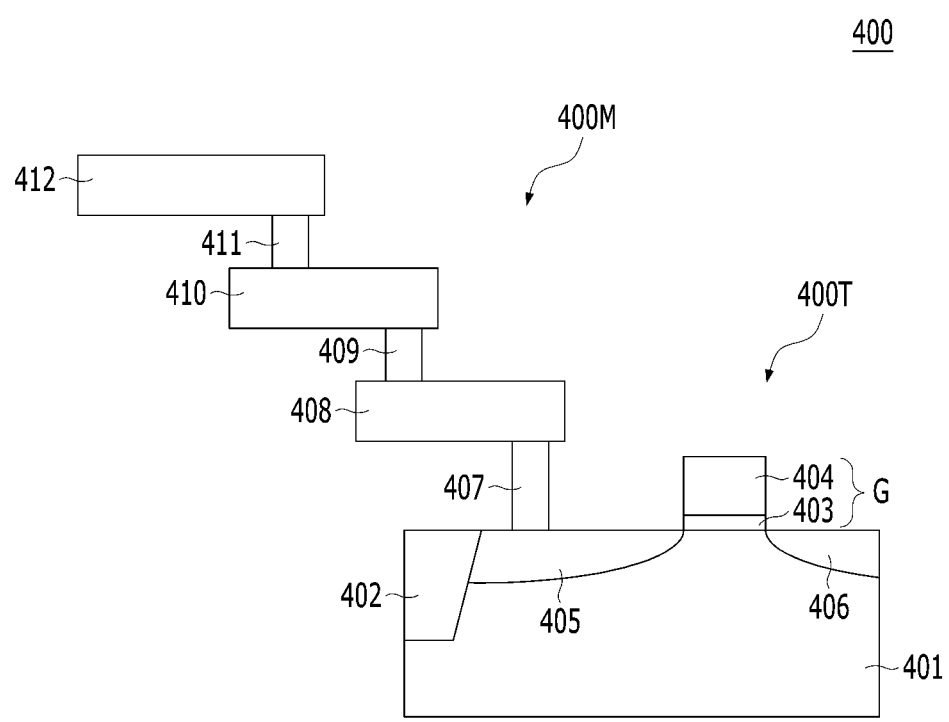
FIG. 5 is a cross-sectional view illustrating a test pattern in accordance with an embodiment of the present invention.

FIG. 5 is a cross-sectional view illustrating a test structure 400 of a semiconductor device in accordance with an embodiment of the present invention.

Referring to FIG. 5, the test structure 400 of a semiconductor device may include a substrate 401, a gate structure G formed over the substrate 401, and multi-level metal interconnections 400M that are formed over the substrate 401 spaced apart from the gate structure G, where at least one of the multi-level metal interconnections 400M is a spiral metal interconnection having a spiral structure whose current flow offsets the plasma-induced damage occurring from other metal interconnections or pads. Each of the metal interconnections 408, 410, and 412 may be coupled to their respective upper and lower structures/layers by corresponding first to third contacts 407, 409, and 411.

In particular, at least one among the first to third metal interconnections 408, 410, and 412 may have a spiral structure when looked from the perspective of a top view. Also, the first metal interconnection 408 of the lowest level among the first to third metal interconnections 408, 410, and 412 may be positioned at a higher level than the gate structure G.

The semiconductor device may include a substrate 401 in which an isolation layer 402 is formed. The substrate 401 may be any material suitable for semiconductor processing. The substrate 401 may be, for example, or include a semiconductor substrate. In an embodiment, the substrate 401 may be formed, for example, of silicon-containing material. The substrate 401 may, for example, be made of or include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In an embodiment, the substrate 401 may be made of or include another semiconductor material, such as germanium. The substrate 401 may, for example, be made of or include a III/V semiconductor substrate, such as a compound semiconductor substrate, e.g., GaAs. In an embodiment, the substrate 401 may include a silicon on insulator (SOI) substrate.

The gate structure G may include a gate dielectric layer 403 and a gate electrode 404. The gate dielectric layer 403 may be made of or include silicon oxide, silicon nitride, silicon oxynitride, or a high-k material. The gate electrode 404 may be made of or include a silicon-containing material or a metal-containing material. The gate electrode 404 may be made of or include polysilicon, tungsten, tungsten silicide, titanium nitride, tantalum nitride, or a combination thereof. The gate electrode 404 may, for example, include doped polysilicon which is doped with an impurity. The impurity may be an N-type impurity or a P-type impurity. Suitable examples of impurities may include boron, arsenic or a combination thereof. Source/drain regions 405 and 406 may be formed in the substrate 401 on both sides of the gate structure G. The source/drain regions 405 and 406 may be doped with the same impurity. The source/drain regions 405 and 406 may include an N-type impurity or a P-type impurity. The source/drain regions 405 and 406 may be regions doped with a high-concentration impurity. In this case, the first to third metal interconnections 408, 410, and 412 may be coupled to one of the source region 405 or the drain region 406.

In an embodiment, the gate structure G and the source/drain regions 405 and 406 may be a test transistor 400T.

The multi-level metal interconnections 400M may be employed for measuring plasma-induced damage mitigation by applying a test voltage. At least one among the first to third metal interconnections 408, 410, and 412 may include a spiral structure. According to another embodiment of the present invention, at least the first metal interconnection 408 of the lowest level among the first to third metal interconnections 408, 410, 412 may have a spiral structure. According to another embodiment of the present invention, the first to third metal interconnections 408, 410, 412 may all have a spiral structure. A spiral structure may be any of the spiral structures described in FIGS. 1A and 1B and FIGS. 2A to 2D.

The first to third metal interconnections 408, 410, and 412 may be or include a suitable metal, such as, for example, tungsten, copper, aluminum, or any combination thereof. The metal interconnection of a spiral structure among the first to third metal interconnections 408, 410, and 412 may have a round shape, such as a circular shape or an elliptical shape. According to another embodiment of the present invention, the metal interconnection of a spiral structure among the first to third metal interconnections 408, 410, and 412 may have an N-angle polygon shape which may include a square, a rectangle, an octagon, and the like. The spiral metal interconnection among the first to third metal interconnections 408, 410, and 412 may be formed in a continuous serial form or in a continuous parallel form as shown in FIG. 4A or 4B. According to another embodiment of the present invention, the spiral metal interconnection among the first to third metal interconnections 408, 410, and 412 may be formed discontinuously as illustrated in FIG. 4C.

Herein, the distance between the lines of the metal interconnection having a spiral structure among the first to third metal interconnections 408, 410, and 412 may range from approximately 1 nm to approximately $1 \times 10^5$ nm. Also, the number N of the spirals wound may range from approximately 1 to approximately 10000. The thickness of each of the multi-level metal interconnections 408, 410, and 412 may range from approximately 1 Å to approximately $1 \times 10^9$ Å.

The first to third metal interconnections 408, 410, and 412 may be coupled to their respective upper and lower layers through the corresponding first to third contacts 407, 409, and 411, respectively. Among the contacts in contact with the metal interconnections, the upward contact may contact the outer end of each metal interconnection, and the downward contact may contact the inner end of each metal interconnection. In other words, the first to third contacts 407, 409, and 411 may be positioned spaced apart from each other in the horizontal direction while not overlapping with each other.

In particular, the first to third metal interconnections 408, 410, and 412 may be coupled to the source/drain regions 405 and 406 through the first contact 407. The first to third contacts 407, 409, and 411 may be referred to as via contacts. The first to third contacts 407, 409, and 411 may be made of or include a silicon-containing material or a metal-containing material. The first to third contacts 407, 409, and 411 may be made of or include polysilicon, a metal, a metal nitride, a metal silicide, or a combination thereof.

The first to third metal interconnections 408, 410, and 412 and the first to third contacts 407, 409, and 411 may be formed through a deposition process and an etching process, individually. In particular, the first to third metal interconnections 408, 410, and 412 may be formed by a line etching process or a damascene process according to the deposition process and the etching method process.

FIGS. 6A to 6F are cross-sectional views illustrating a method for fabricating a metal interconnection according to a line etching process in accordance with an embodiment of the present invention.

Figure 6A:
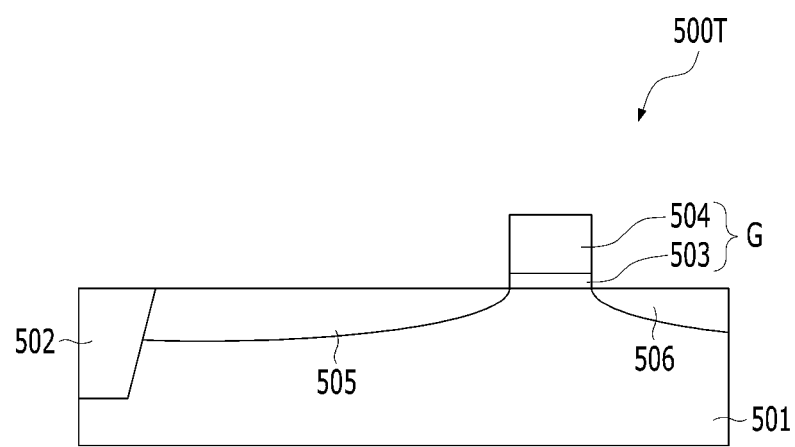
FIGS. 6A to 6F are cross-sectional views illustrating a method for fabricating a metal interconnection according to a line etching process in accordance with an embodiment of the present invention.

Referring to FIG. 6A, a gate structure G may be formed over the substrate 501 including the isolation layer 502. The isolation layer 502 may be formed by a Shallow Trench Isolation (STI) process. For example, after a trench is formed in the substrate 501, the trench may be filled with a dielectric material. The isolation layer 502 may, for example, be made of or include silicon oxide, silicon nitride, or a combination thereof.

The substrate 501 may be any material suitable for semiconductor processing. The substrate 501 may, for example, be or include a semiconductor substrate. In an embodiment, he substrate 501 may be formed of, for example, silicon-containing material. The substrate 501 may be or include, for example, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 501 may be or include another semiconductor material such as germanium. For example, the substrate 501 may include a group III/V semiconductor substrate, such as a compound semiconductor substrate, e.g., GaAs. In an embodiment, the substrate 501 may include a silicon on insulator (SOI) substrate.

The gate structure G may include a gate dielectric layer 503 and a gate electrode 504. The gate dielectric layer 503 may be or include, for example, oxide, silicon nitride, silicon oxynitride, or a high-k material. The gate electrode 504 may be made of or include a silicon-containing material or a metal-containing material. The gate electrode 504 may be made of or include polysilicon, tungsten, tungsten silicide, titanium nitride, tantalum nitride, or a combination thereof. The gate electrode 504 may, for example, include doped polysilicon which is doped with an impurity. Suitable examples of impurities may include an N-type impurity or a P-type impurity. Suitable examples of impurities may include boron, arsenic or a combination thereof. The substrates 501 on both sides of the gate structure G may include source/drain regions 505 and 506. The source/drain regions 505 and 506 may be doped with the same impurity. The source/drain regions 505 and 506 may include an N-type impurity or a P-type impurity. For example, the source/drain regions 505 and 506 may be regions doped with a high-concentration impurity.

In an embodiment, the gate structure G and the source/drain regions 505 and 506 may be a test transistor 500T.

Figure 6B:
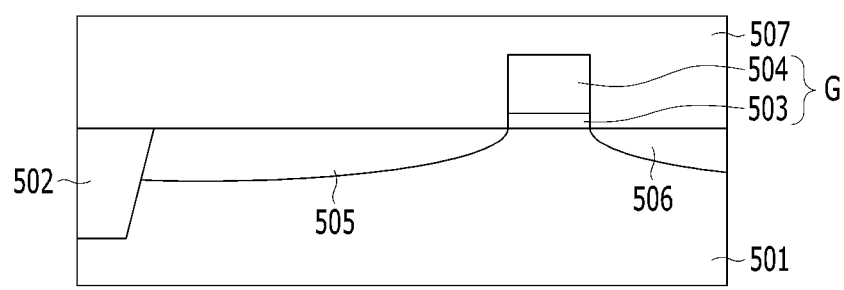

Referring to FIG. 6B, a first inter-layer dielectric layer 507 may be formed over the profile of the substrate 501 including the gate structure G. The first inter-layer dielectric layer 507 may be made of or include a low-k material. The first inter-layer dielectric layer 507 may be formed of silicon oxide, silicon nitride, or a low-k material including silicon carbon and boron.

Figure 6C:
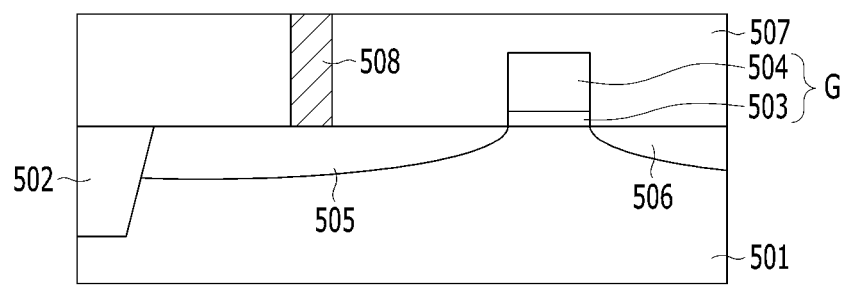

Referring to FIG. 6C, a first contact 508 may be formed to be coupled to the substrate 501 by penetrating through the first inter-layer dielectric layer 507.

To form the first contact 508, first, a contact hole (not shown) may be formed to penetrate through the first inter-layer dielectric layer 507 to open the source/drain region 505 of the substrate 501. Subsequently, a series of processes for forming a conductive material to fill the contact hole and performing an etching process such that the conductive material fills only the inside of the contact hole may be performed.

The first contact 508 may be made of or include a silicon-containing material or a metal-containing material. The first contact 508 may be made of or include polysilicon, a metal, a metal nitride, a metal silicide, or a combination thereof.

Figure 6D:
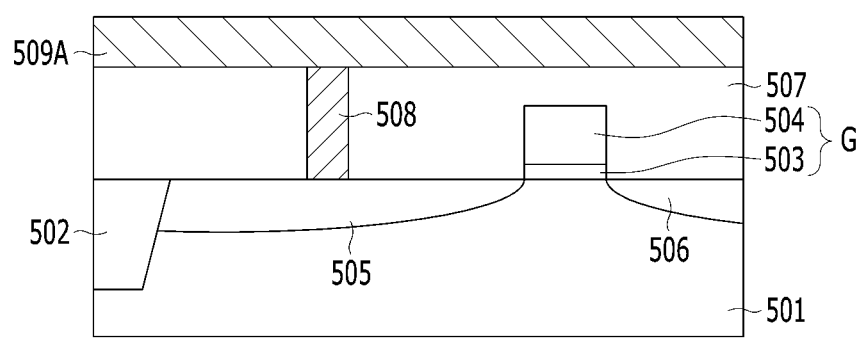

Referring to FIG. 6D, a conductive material 509A may be formed over the first contact 508 and the first inter-layer dielectric layer 507. The conductive material 509A may be or include a metal material. The conductive material 509A for wiring may be or include a suitable metal, such as, for example, tungsten, copper, aluminum, or any combination thereof.

Figure 6E:
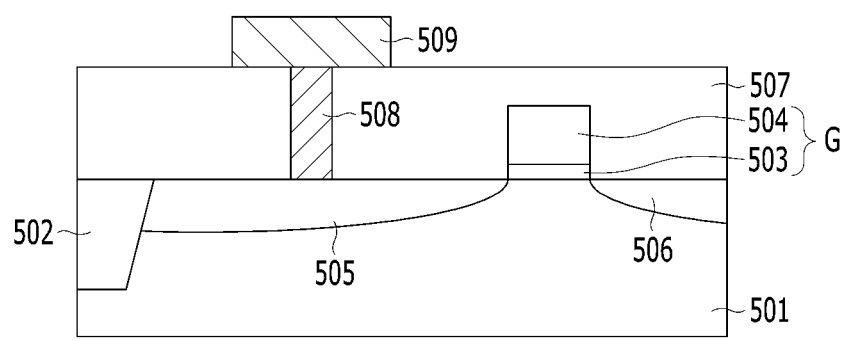

Referring to FIG. 6E, the conductive material 509A of FIG. 6D may be etched to form a first metal interconnection 509. The first metal interconnection 509 may be coupled to the source/drain region 505 of the substrate 501 through the first contact 508. A plasma etching process may be performed to form the first metal interconnection 509.

The first metal interconnection 509 may be or include a suitable metal, such as, for example, tungsten, copper, aluminum, or combinations thereof. The first metal interconnection 509 may have a spiral structure having a round shape, such as a circular shape or an elliptical shape. According to another embodiment of the present invention, the first metal interconnection 509 may have a spiral structure of a polygon shape which may include a square, a rectangle, an octagon, and the like.

Herein, the distance between the lines of the first metal interconnection 509 forming the spiral structure on the same plane may range from approximately 1 nm to approximately $1 \times 10^5$ nm. Also, the number N of the spirals wound may range from approximately 1 to approximately 10000. The thickness of the first metal interconnection 509 may range from approximately 1 521 to approximately $1 \times 10^9$ Å.

Figure 6F:
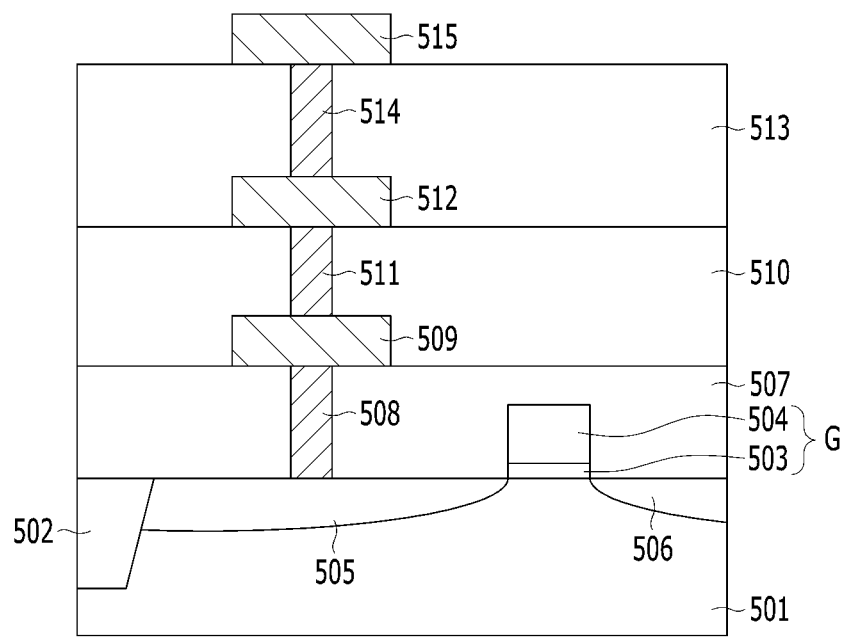

Referring to FIG. 6F, the second and third metal interconnections 512 and 515 coupled to the first metal interconnection 509 may be formed over the first metal interconnection 509. The first metal interconnection 509 to the third metal interconnection 515 may be coupled to their respective lower layer through a corresponding contact of the first to third contacts 508, 511, and 514. In order to form the second and third contacts 511 and 514, and the second and third metal interconnections 512 and 515, the processes of FIGS. 6B to 6E may be performed repeatedly as described above. According to the embodiment of the present invention, the first to third contacts 508, 511, and 514 may be positioned on the same line in the vertical direction, but this corresponds to a cross-sectional view based only on the downward contact. When the positions of the upward contact and the downward contact are taken into consideration as shown in FIG. 3 or 5, the first to third contacts 508, 511, and 514 may be positioned spaced apart from each other in the horizontal direction by a predetermined distance while not overlapping with each other.

The second and third inter-layer dielectric layers 510 and 513 may be formed of the same material as the first inter-layer dielectric layer 507. The second and third inter-layer dielectric layers 510 and 513 may be made of or include a low-k material. For example, the second and third inter-layer dielectric layers 510 and 513 may be formed, for example, of one among silicon oxide, silicon nitride, or a low-k material including silicon carbon and boron.

The second and third contacts 511 and 514 may be formed of the same material as the first contact 508. The second and third contacts 511 and 514 may be made of or include a silicon-containing material or a metal-containing material. The second and third contacts 511 and 514 may be made of or include polysilicon, a metal, a metal nitride, a metal silicide, or a combination thereof.

The second and third metal interconnections 512 and 515 may be formed of the same material and structure as the first metal interconnection 509. The second and third metal interconnections 512 and 515 may be or include a metal material. The second and third metal interconnections 512 and 515 may be or include a suitable metal, such as, for example, tungsten, copper, aluminum, or combinations thereof.

The second and third metal interconnections 512 and 515 may both have a spiral structure. According to another embodiment of the present invention, at least one of the second metal interconnection 512 and the third metal interconnection 515 may have a spiral structure. According to another embodiment of the present invention, at least one among the first to third metal interconnections 509, 512 and 515 may have a spiral structure. Herein, the spiral structure may have a round shape such as a circular shape or an elliptical shape. According to another embodiment of the present invention, the spiral structure may have a polygon shape including a square, a rectangle, an octagon and the like. The spiral metal interconnection among the first to third metal interconnections 509, 512 and 515 may be formed in a continuous serial structure or in a continuous parallel structure as illustrated in FIG. 4A or 4B. According to another embodiment of the present invention, the spiral metal interconnection among the first to third metal interconnections 509, 512, and 515 may be formed discontinuously as illustrated in FIG. 4C.

Herein, the distance between the lines of the metal interconnection having a spiral structure in any of the second metal interconnection 512 and the third metal interconnection 515 may range from approximately 1 nm to approximately $1 \times 10^5$ nm. Also, the number N of the spirals wound may range from approximately 1 to approximately 10000. The thickness of each of the second and third metal interconnections 512 and 515 may range from approximately 1 Å to approximately $1 \times 10^9$ Å.

FIGS. 7A to 7G are cross-sectional views illustrating a method for fabricating a metal interconnection according to a damascene process in accordance with an embodiment of the present invention.

Figure 7A:
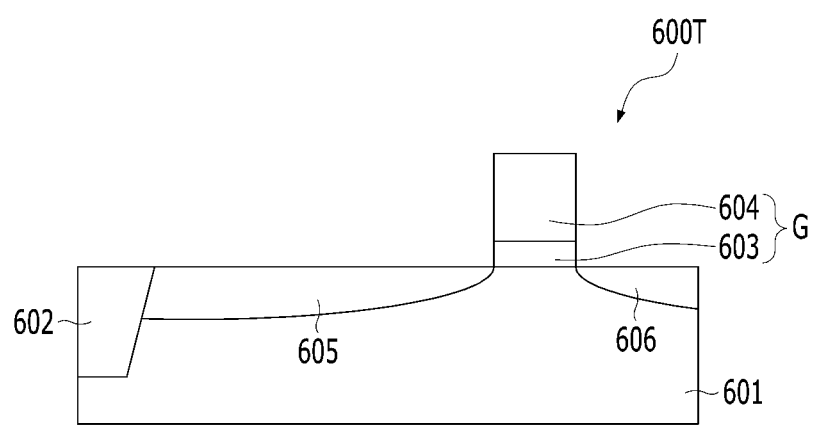
FIGS. 7A to 7G are cross-sectional views illustrating a method for fabricating a metal interconnection according to a damascene process in accordance with an embodiment of the present invention.

Referring to FIG. 7A, a gate structure G may be formed over a substrate 601 including an isolation layer 602. The isolation layer 602 may be formed by a Shallow Trench Isolation (STI) process. For example, after a trench is formed in the substrate 601, the trench may be filled with a dielectric material. The isolation layer 602 may, for example, include silicon oxide, silicon nitride, or a combination thereof.

The substrate 601 may be any material suitable for semiconductor processing. The substrate 601 may be or include a semiconductor substrate. The substrate 601 may be formed of, for example, silicon-containing material. The substrate 601 may be or include, for example, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 601 may be or include another semiconductor material such as germanium. The substrate 601 may be or include, for example, a group-III/V semiconductor substrate, such as a compound semiconductor substrate, e.g., GaAs. In an embodiment, the substrate 601 may include a silicon on insulator (SOI) substrate.

The gate structure G may include a gate dielectric layer 603 and a gate electrode 604. The gate dielectric layer 603 may be or include, for example, oxide, silicon nitride, silicon oxynitride, or a high-k material. The gate electrode 604 may be made of or include a silicon-containing material or a metal-containing material. The gate electrode 604 may be made of or include polysilicon, tungsten, tungsten silicide, titanium nitride, tantalum nitride, or a combination thereof. The gate electrode 604 may, for example, include doped polysilicon which is doped with an impurity. Suitable examples of impurities may include an N-type impurity or a P-type impurity. Suitable examples of impurities may include boron, arsenic or a combination thereof. The substrate 601 on both sides of the gate structure G may include source/drain regions 605 and 606. The source/drain regions 605 and 606 may be doped with the same impurity. The source/drain regions 605 and 606 may include an N-type impurity or a P-type impurity. The source/drain regions 605 and 606 may be regions doped with a high-concentration impurity.

In an embodiment, the gate structure G and the source/drain regions 605 and 606 may be a test transistor 600T.

Figure 7B:
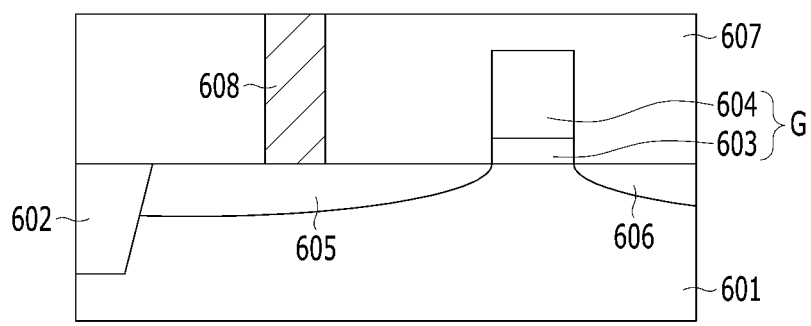

Referring to FIG. 7B, a first inter-layer dielectric layer 607 may be formed over the profile of the substrate 601 including the gate structure G. The first inter-layer dielectric layer 607 may be made of or include a low-k material. The first inter-layer dielectric layer 607 may be formed, for example, of one among silicon oxide, silicon nitride, or a low-k material including silicon carbon and boron.

Subsequently, a first contact 608 coupled to the substrate 601 may be formed by penetrating through the first inter-layer dielectric layer 607.

To form the first contact 608, first, a contact hole may be formed to penetrate through the first inter-layer dielectric layer 607 to open the source/drain regions 605 of the substrate 601. Subsequently, a series of processes for forming a conductive material filling the contact hole and performing an etching process such that the conductive material fills only the inside of the contact hole may be performed.

The first contact 608 may be made of or include a silicon-containing material or a metal-containing material. The first contact 608 may be made of or include polysilicon, a metal, a metal nitride, a metal silicide, or a combination thereof.

Figure 7C:
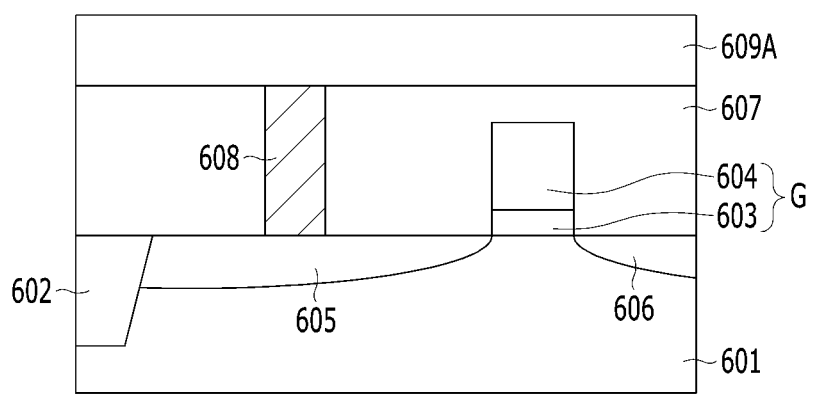

Referring to FIG. 7C, a dielectric material 609A may be formed over the first contact 608 and the first inter-layer dielectric layer 607. The dielectric material 609A may be formed of the same material as that of the first inter-layer dielectric layer 607 to perform a damascene process for subsequent formation of a metal interconnection. The dielectric material 609A may be made of or include a low-k material. The dielectric material 609A may be formed, for example, of one among silicon oxide, silicon nitride or a low-k material including silicon carbon and boron.

Figure 7D:
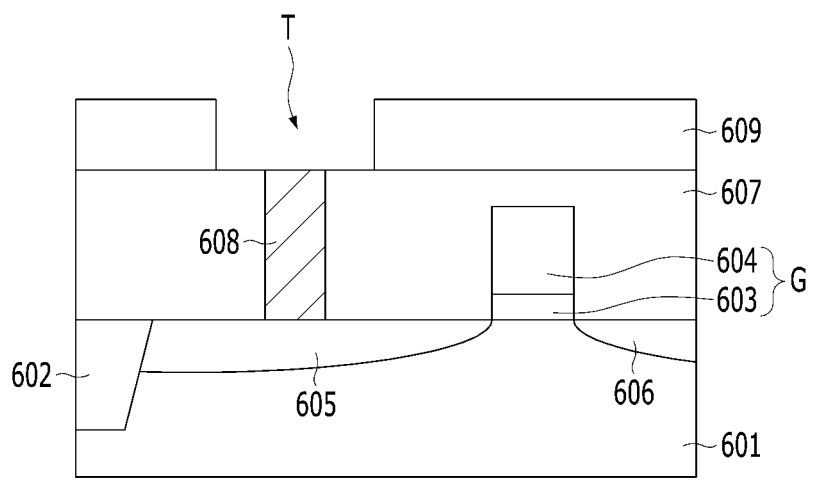

Referring to FIG. 7D, the dielectric material 609A shown in FIG. 7C may be etched to form a second inter-layer dielectric layer 609 defining a trench T that exposes the first contact 608.

The trench T may have a spiral structure of a round shape, such as a circular shape or an elliptical shape. According to another embodiment of the present invention, the trench T may have a spiral structure of a polygon which may include a square, a rectangle, an octagon and the like.

The distance between the lines of the trench T forming a spiral structure on the same plane may range from approximately 1 nm to approximately $1 \times 10^5$ nm. Also, the number N of the spirals which are wound around the central point of the spiral structure may range from approximately 1 to approximately 10000. The depth of the trench T may range from approximately 1 Å to approximately $1 \times 10^9$ Å.

Figure 7E:
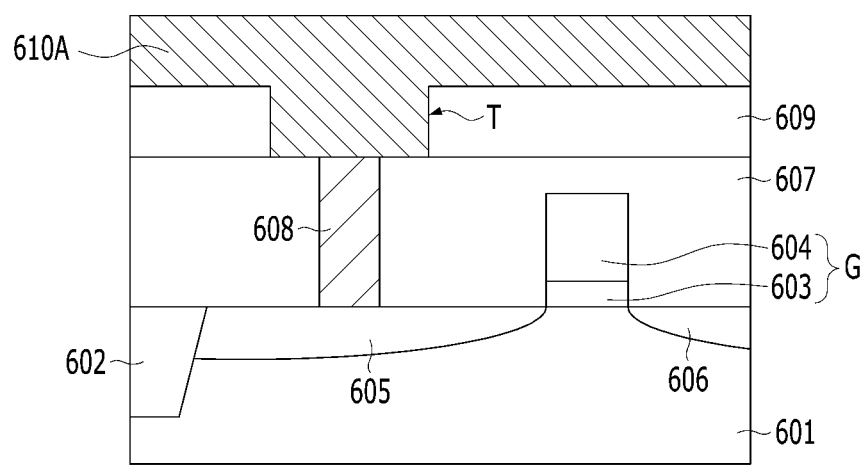

Referring to FIG. 7E, a conductive material 610A may be formed in the trench T (see FIG. 7D). The conductive material 610A may be or include a metal material. The conductive material 610A may be or include a suitable metal, such as, for example, tungsten, copper, aluminum, or any combination thereof. Before the conductive material 610A is formed, a diffusion barrier layer (not shown) may be formed over the profile of the substrate including the trench T (see FIG. 7D).

Figure 7F:
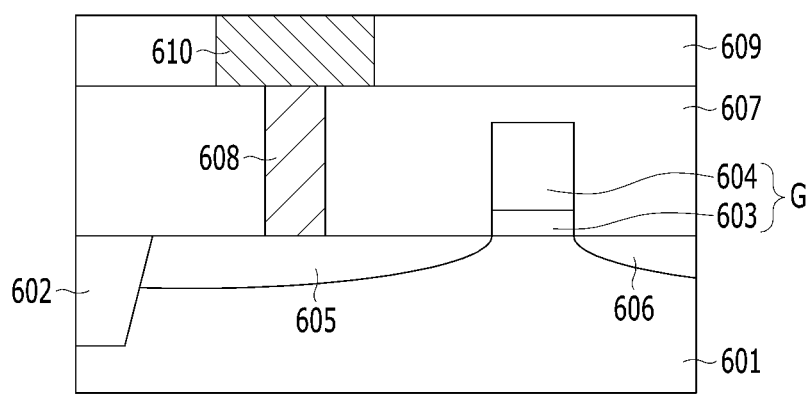

Referring to FIG. 7F, a first metal interconnection 610 may be formed by performing an etching process in such a manner that the conductive material 610A (see FIG. 7E) gap-fills only the inside of the trench T (see FIG. 7D). The first metal interconnection 610 may be coupled to the source/drain region 605 of the substrate 601 through the first contact 608.

Since the first metal interconnection 610 is buried in the trench T of FIG. 7D, the first metal interconnection 610 may have a spiral structure having a round shape, such as a circular shape or an elliptical shape, which is the same as the shape of the trench T. According to another embodiment of the present invention, the first metal interconnection 610 may have a spiral structure of a polygon shape which may include a square, a rectangle, an octagon, and the like.

Figure 7G:
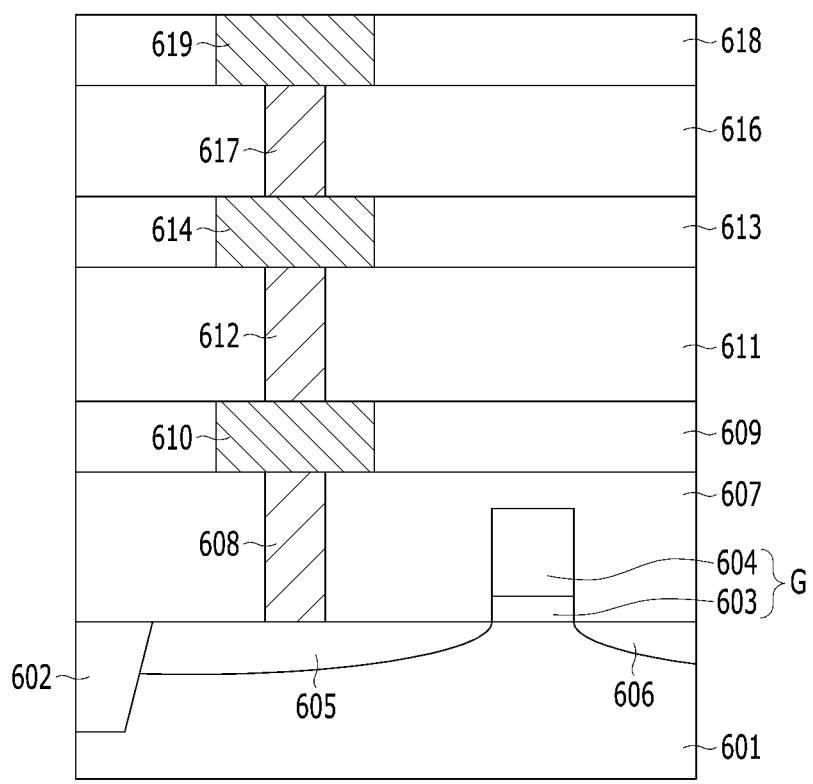

Referring to FIG. 7G, second and third contacts 612 and 617, and second and third metal interconnections 614 and 619 may be formed to be coupled to the first metal interconnection 610 over the first metal interconnection 610. The first metal interconnection 610 to the third metal interconnection 619 may be coupled to their respective lower layer through a corresponding one of first to third contacts 608, 612, and 617. As described above, the processes of FIGS. 7C to 7F may be repeated to form the second and third contacts 612 and 617, and the second and third metal interconnections 614 and 619. According to the embodiment of the present invention, the first to third contacts 608, 612, and 617 may be positioned on the same line in the vertical direction. However, this corresponds to a cross-sectional view only based on the downward contact. When all the positions of the upward contact and the downward contact are taken into consideration as shown in FIGS. 3 and 5, the first to third contacts 608, 612, and 617 may be positioned to be spaced apart from each other in the horizontal direction while not overlapping with each other.

The third to sixth inter-layer dielectric layers 611, 613, 616, and 618 may be formed of the same material as the first and second inter-layer dielectric layers 607 and 609. The third to sixth inter-layer dielectric layers 611, 613, 616, and 618 may be made of or include a low-k material. The third to sixth inter-layer dielectric layers 611, 613, 616, and 618 may be formed, for example, of one among silicon oxide, silicon nitride, or a low-k material including silicon carbon and boron.

The second and third contacts 612 and 617 may be formed of the same material as the first contact 608. The second and third contacts 612 and 617 may be made of or include a silicon-containing material or a metal-containing material. The second and third contacts 612 and 617 may be made of or include polysilicon, a metal, a metal nitride, a metal silicide, or a combination thereof.

The second and third metal interconnections 614 and 619 may be formed of the same material and structure as the first metal interconnection 610. The second and third metal interconnections 614 and 619 may be or include a metal material. The second and third metal interconnections 614 and 619 may be or include a suitable metal, such as, for example, tungsten, copper, aluminum, or combinations thereof.

The second and third metal interconnections 614 and 619 may both have a spiral structure. According to another embodiment of the present invention, at least one between the second metal interconnection 614 and the third metal interconnection 619 may have a spiral structure. According to another embodiment of the present invention, at least one among the first to third metal interconnections 610, 614 and 619 may have a spiral structure. Herein, the spiral structure may have a round shape, such as a circular shape or an elliptical shape. According to another embodiment of the present invention, the spiral structure may have a polygon shape including a square, a rectangle, an octagon, and the like. The spiral metal interconnection among the first to third metal interconnections 610, 614, and 619 may be formed in a continuous serial form or in a continuous parallel form as illustrated in FIG. 4A or 4B. According to another embodiment of the present invention, the spiral metal interconnection among the first to third metal interconnections 610, 614, and 619 may be formed discontinuously as illustrated in FIG. 4C.

Herein, the distance between the lines of the metal interconnection having a spiral structure between the second and third metal interconnections 614 and 619 may range from approximately 1 nm to approximately $1 \times 10^5$ nm. Also, the number N of spirals which are wound around the central point of the spiral structure may range from approximately 1 to approximately 10000. The thickness of each of the second and third metal interconnections 614 and 619 may range from approximately 1 Å to approximately $1 \times 10^9$ Å.

FIGS. 8A to 8F are cross-sectional views illustrating a method for fabricating a metal interconnection according to a dual damascene process in accordance with an embodiment of the present invention.

Figure 8A:
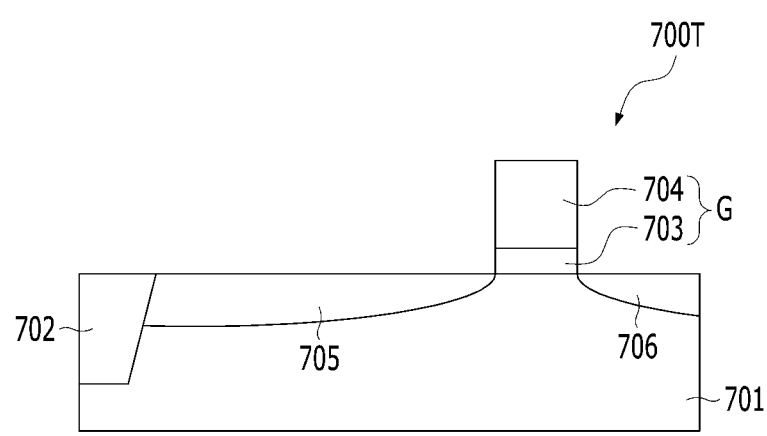
FIGS. 8A to 8F are cross-sectional views illustrating a method for fabricating a metal interconnection according to a dual damascene process in accordance with an embodiment of the present invention.

Referring to FIG. 8A, a gate structure G may be formed over a substrate 701 including an isolation layer 702. The isolation layer 702 may be formed by a shallow trench isolation (STI) process. For example, after a trench is formed in the substrate 701, the trench may be filled with a dielectric material. The isolation layer 702 may be or include, for example, oxide, silicon nitride, or a combination thereof.

The substrate 701 may be any material suitable for semiconductor processing. The substrate 701 may be or include a semiconductor substrate. The substrate 701 may be formed of, for example, silicon-containing material. The substrate 701 may be or include, for example, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 701 may be or include another semiconductor material, such as germanium. The substrate 701 may be or include, for example, a group-III/V semiconductor substrate, such as a compound semiconductor substrate, e.g., GaAs. In an embodiment, the substrate 701 may include a silicon on insulator (SOI) substrate.

The gate structure G may include a gate dielectric layer 703 and a gate electrode 704. The gate dielectric layer 703 may be or include, for example, oxide, silicon nitride, silicon oxynitride, or a high-k material. The gate electrode 704 may be made of or include a silicon-containing material or a metal-containing material. The gate electrode 704 may be made of or include polysilicon, tungsten, tungsten silicide, titanium nitride, tantalum nitride, or a combination thereof. The gate electrode 704 may, for example, include doped polysilicon doped with an impurity. Suitable examples of impurities may include an N-type impurity or a P-type impurity. Suitable examples of impurities may include boron, arsenic or a combination thereof. Source/drain regions 705 and 706 may be formed in the substrates 701 on both sides of the gate structure G. The source/drain regions 705 and 706 may be doped with the same impurity. The source/drain regions 705 and 706 may include an N-type impurity or a P-type impurity. The source/drain regions 705 and 706 may be regions doped with a high-concentration impurity.

In an embodiment, the gate structure G and the source/drain regions 705 and 706 may be a test transistor 700T.

Figure 8B:
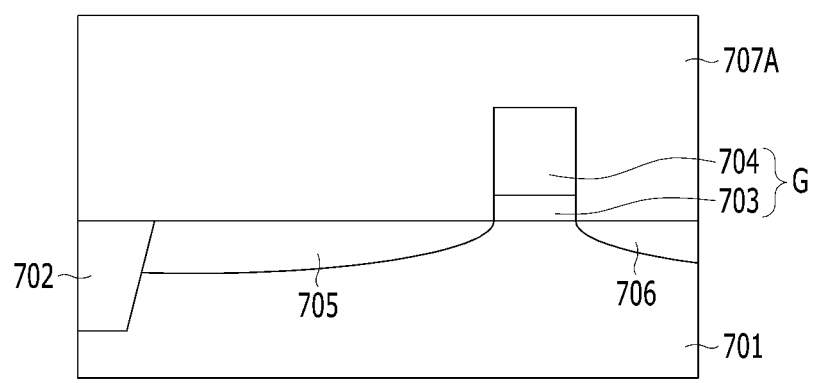

Referring to FIG. 8B, a dielectric layer 707A may be formed over the profile of the substrate 701 including the gate structure G. The dielectric layer 707A may be made of or include a low-k material. The dielectric layer 707A may be formed, for example, of one among silicon oxide, silicon nitride, or a low-k material including silicon carbon and boron.

Figure 8C:
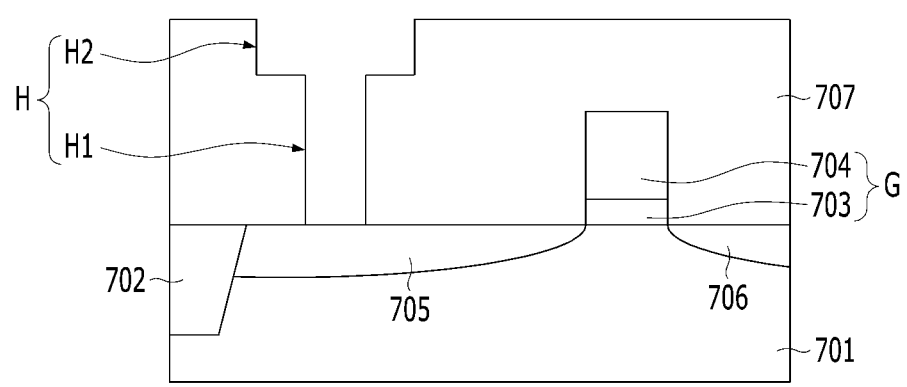

Referring to FIG. 8C, the dielectric layer 707A shown in FIG. 8B may be etched. As a result, a hole H having a dual damascene structure defining a via contact region H1 and a metal interconnection region H2 may be provided in the first inter-layer dielectric layer 707. The dual damascene process for forming the hole H having the dual damascene structure may be a via-first dual damascene process, a trench-first dual damascene process, or a trench-first self-aligned via process. According to another embodiment of the present invention, the dual damascene process may include a partial via-first dual damascene process and a partial trench-first dual damascene process.

The via contact region H1 may have a columnar shape that is locally opened for connection with the lower layer. The metal interconnection region H2 may have a spiral structure having a round shape, such as a circular shape or an elliptical shape. According to another embodiment of the present invention, the metal interconnection region H2 may have a spiral structure of a polygon shape including a square, a rectangle, an octagon, and the like.

Herein, the distance between the lines of the metal interconnection region H2 forming a spiral structure on the same plane may range from approximately 1 nm to approximately $1 \times 10^5$ nm. Also, the number N of the spirals wound may range from approximately 1 to approximately 10000. The depth of the metal interconnection region H2 may range from approximately 1 Å to approximately $1 \times 10^9$ Å.

Figure 8D:
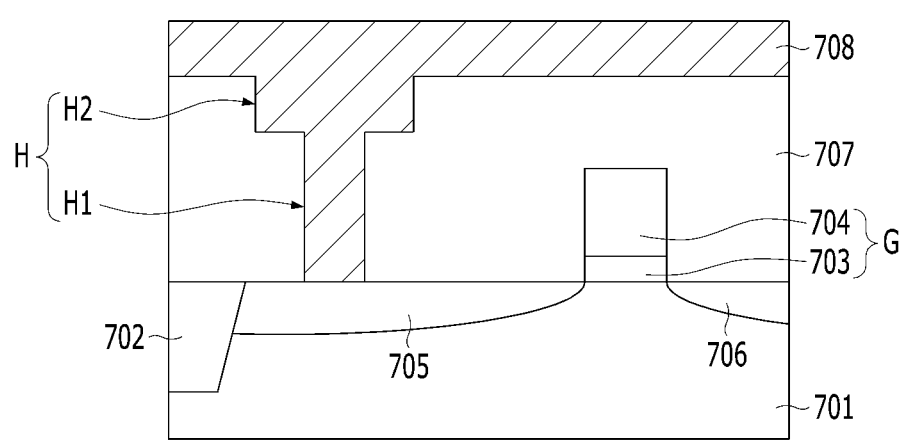

Referring to FIG. 8D, a conductive material 708 filling the hole H may be formed. The conductive material 708 may be or include a metal material. The conductive material 708 may be or include a suitable metal, such as, for example, tungsten, copper, aluminum, or combinations thereof. Before the conductive material 708 is formed, a diffusion barrier layer (not shown) may be formed over the profile of the substrate including the hole H.

Figure 8E:
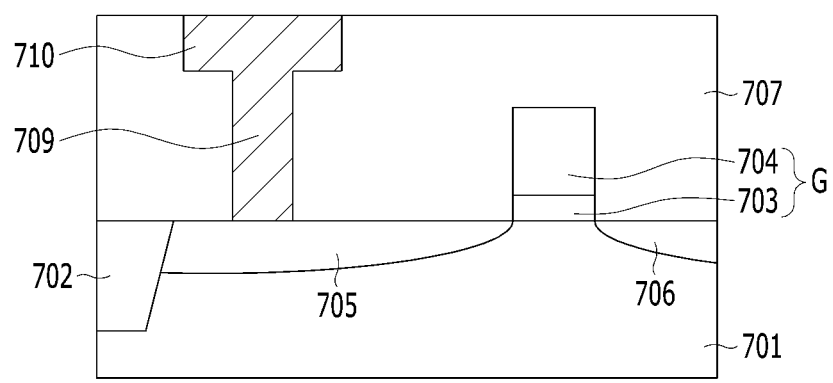

Referring to FIG. 8E, the conductive material 708 of FIG. 8D may be etched to form a first via contact 709 and a first metal interconnection 710. The first via contact 709 may have a columnar structure that is locally open in the same shape as the via contact region H1. The first metal interconnection 710 may have the same shape as the metal interconnection region H2. In other words, the first metal interconnection 710 may have a spiral structure of a round shape, such as a circular shape or an elliptical shape. According to another embodiment of the present invention, the first metal interconnection 710 may have a spiral structure of a polygon shape including a square, a rectangle, an octagon, and the like.

Figure 8F:
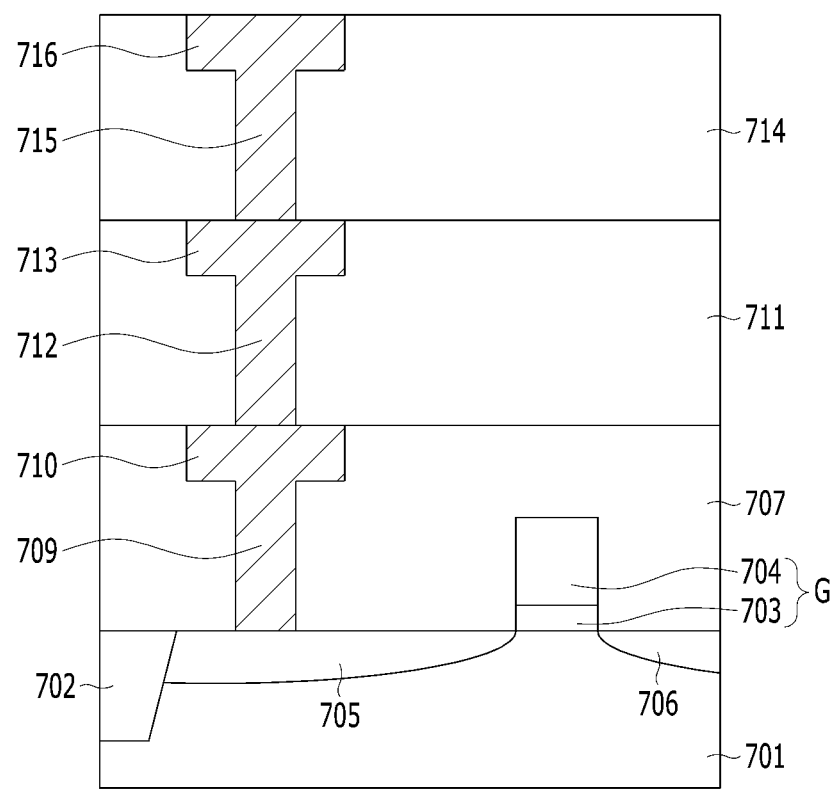

Referring to FIG. 8F, second and third via contacts 712 and 715, and second and third metal interconnections 713 and 716 may be formed to be coupled to the first metal interconnection 710 over the first metal interconnection 710. The second and third via contacts 712 and 715, and the second and third metal interconnections 713 and 716 may be formed by repeatedly performing the processes of FIGS. 8B to 8E. According to the embodiment of the present invention, the first to third via contacts 709, 712, and 715 may be positioned on the same line in the vertical direction. However, this position corresponds to a cross-sectional view based only on the downward contact. When the positions of the upward contact and the downward contact are all taken into consideration, as illustrated in FIG. 3 or 5, the first to third via contacts 709, 712, and 715 may be positioned spaced apart from each other in the horizontal direction while not overlapping with each other.

Second and third inter-layer dielectric layers 711 and 714 may be interposed around the second and third metal interconnections 713 and 716. The second and third inter-layer dielectric layers 711 and 714 may be formed of the same material as the first inter-layer dielectric layer 707. The second and third inter-layer dielectric layers 711 and 714 may be made of or include a low-k material. The second and third inter-layer dielectric layers 711 and 714 may be formed, for example, of one among silicon oxide, silicon nitride, or a low-k material including silicon carbon and boron.

The second and third via contacts 712 and 715 and the second and third metal interconnections 713 and 716 may be formed of the same material and structure as the first via contact 709 and the first metal interconnection 710, respectively. The second and third via contacts 712 and 715, and the second and third metal interconnections 713 and 716 may be or include a metal material. The second and third via contacts 712 and 715, and the second and third metal interconnections 713 and 716 may be or include a suitable metal, such as, for example, tungsten, copper, aluminum, or combinations thereof.

The second and third via contacts 712 and 715 may have a columnar structure that is locally opened in the same shape as the first via contact 709. The second and third metal interconnections 713 and 716 may be spiral structures having a round shape, such as a circular shape or an elliptical shape. According to another embodiment of the present invention, the second and third metal interconnections 713 and 716 may have a spiral structure of a polygon shape including a square, a rectangle, an octagon, and the like.

The second and third metal interconnections 713 and 716 may both have a spiral structure. According to another embodiment of the present invention, at least one between the second metal interconnection 713 and the third metal interconnection 716 may have a spiral structure. According to another embodiment of the present invention, at least one among the first to third metal interconnections 710, 713 and 716 may have a spiral structure. Herein, the spiral structure may have a round shape, such as a circular shape or an elliptical shape. According to another embodiment of the present invention, the spiral structure may have a polygon shape including a square, a rectangle, an octagon, and the like. The spiral metal interconnections among the first to third metal interconnections 710, 713 and 716 may be formed in a continuous serial structure or in a continuous parallel structure as illustrated in FIG. 4A or 4B. According to another embodiment of the present invention, the spiral metal interconnection among the first to third metal interconnections 710, 713 and 716 may be formed discontinuously as illustrated in FIG. 4C.

Herein, the distance between the lines of the metal interconnection having a spiral structure in the second metal interconnection 713 and the third metal interconnection 716 may range from approximately 1 nm to approximately $1 \times 10^5$ nm. Also, the number N of the spirals wound may range from approximately 1 to approximately 10000. The thickness of each of the second and third metal interconnections 713 and 716 may range from approximately 1 Å to approximately $1 \times 10^9$ Å.

Figure 9:
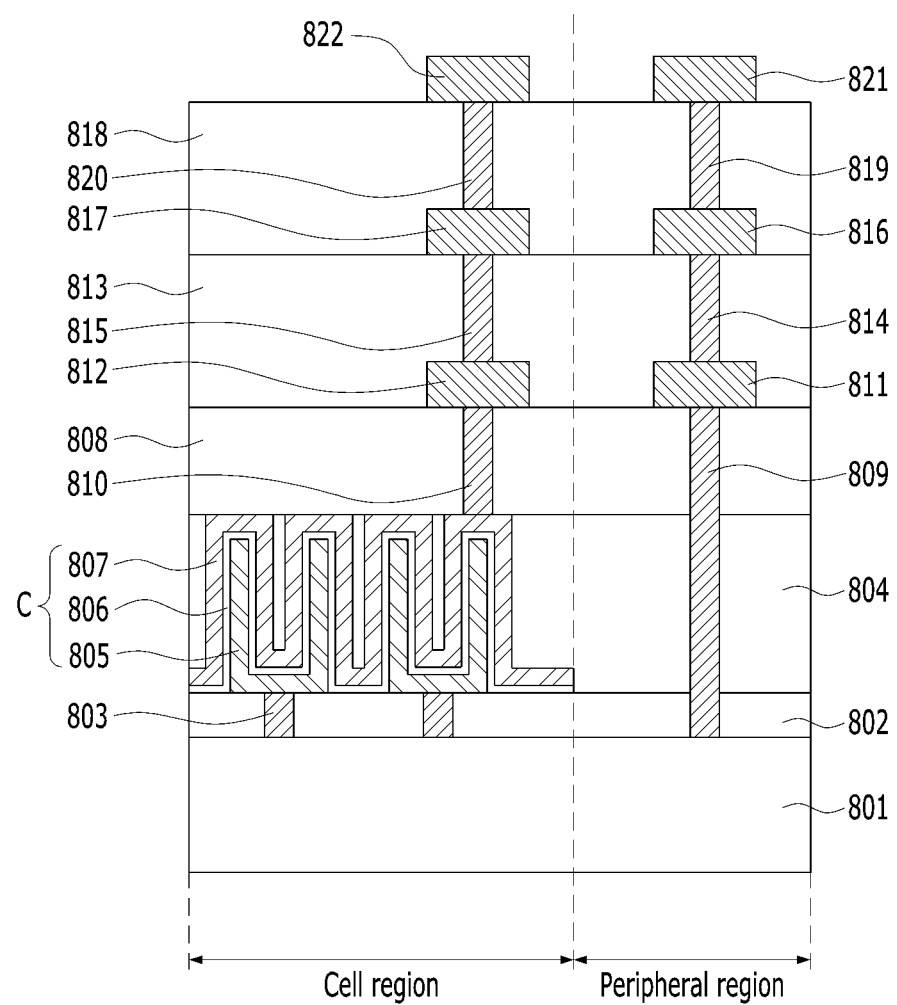
FIG. 9 is a cross-sectional view illustrating a semiconductor device in accordance with an embodiment of the present invention.

FIG. 9 is a cross-sectional view illustrating a semiconductor device in accordance with an embodiment of the present invention.

Referring to FIG. 9, the semiconductor device may include multi-level metal interconnections 812 and 817 over a substrate 801 and a top pad 822 formed over the multi-level metal interconnections 812 and 817. The semiconductor device may include a cell region and a peripheral region, and the multi-level cell metal interconnections 812 and 817 and the multi-level peripheral metal interconnections 811 and 816 may be formed in the cell region and the peripheral region, respectively. At least one among the multi-level cell metal interconnections 812 and 817 and the multi-level peripheral metal interconnections 811 and 816 may be a spiral metal interconnection having a spiral top view.

In the cell region of the semiconductor device, a capacitor C, the multi-level cell metal interconnections 812 and 817, and the cell pad 822 may be sequentially formed over the substrate 801 including a series of structures (not shown). In the peripheral region of the semiconductor device, multi-level peripheral metal interconnections 811 and 816 and peripheral pads 821 may be sequentially formed over the substrate 801 including a series of structures (not shown).

The substrate 801 may be any material suitable for semiconductor processing. The substrate 801 may be or include a semiconductor substrate. The substrate 801 may be formed of, for example, silicon-containing material. The substrate 801 may be or include another semiconductor material, such as germanium. The substrate 801 may be or include, for example, a group-III/V semiconductor substrate, such as a compound semiconductor substrate, e.g., GaAs. In an embodiment, the substrate 801 may include a silicon on insulator (SOI) substrate.

The series of structures (not shown) may include a gate and a bit line formed over the substrate 801 of the cell region, and may include a gate formed over the substrate 801 of the peripheral region.

A first inter-layer dielectric layer 802 may be formed between the capacitor C and the substrate 801. The first inter-layer dielectric layer 802 may be made of or include a low-k material. The first inter-layer dielectric layer 802 may be formed, for example, of one among silicon oxide, silicon nitride, and a low-k material including silicon carbon and boron.

The capacitor C may include a stacked structure of a lower electrode 805, a dielectric layer 806, and an upper electrode 807. Although a capacitor C of a cylindrical structure is illustrated in the embodiment of the present invention, the concept and spirit of the present invention are not limited to the cylindrical structure and the capacitor C may include a capacitor of all structures including a pillar structure. The lower electrode 805 may include a metal-containing material. The lower electrode 805 may include a metal, a metal nitride, a conductive metal oxide, or a combination thereof. The lower electrode 805 may include titanium (Ti), titanium nitride (TiN), tantalum nitride (TaN), tungsten (W), tungsten nitride (WN), ruthenium, iridium, ruthenium oxide, iridium oxide, or a combination thereof. According to another embodiment of the present invention, the lower electrode 805 may be made of or include a silicon-containing material. The lower electrode 805 may include a silicon layer, a silicon germanium layer, or a combination thereof.

The dielectric layer 806 may be a single layer, a multi-layer, or a laminate structure. The dielectric layer 806 may contact the lower electrode 805. The dielectric layer 806 may be made of or include a high-k material. The high-k material may have a dielectric constant of approximately 20 or more. The high-k material may, for example, include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 806 may be a composite layer including two or more layers of the high-k materials mentioned above. The dielectric layer 806 may be formed of zirconium-based oxide. The dielectric layer 806 may have a multi-layer structure including zirconium oxide ($ZrO_2$). According to another embodiment of the present invention, the dielectric layer 806 may be formed of hafnium-based oxide. The dielectric layer 806 may be a multi-layer structure including hafnium oxide. According to another embodiment of the present invention, the dielectric layer 806 may include a stack of a high-k material and a high-band gap material having a greater band gap than the high-k material. According to another embodiment of the present invention, the dielectric layer 806 may include laminates such as ZAZA (ZrO2/Al2O3/ZrO2/Al2O3), HAHA (HfO2/Al2O3/HfO2/Al2O3).

The upper electrode 807 may be formed in a single layer or a multi-layer. The upper electrode 807 may include a metal-containing material. The upper electrode 807 may be formed of or include a metal, a metal nitride, a conductive metal oxide, or a combination thereof. The upper electrode 807 may be formed of or include titanium (Ti), titanium nitride (TiN), tantalum nitride (TaN), tungsten (W), tungsten nitride (WN), ruthenium, iridium, ruthenium oxide, iridium oxide, or a combination thereof. According to another embodiment of the present invention, the upper electrode 807 may be made of or include a silicon-containing material. The upper electrode 807 may be formed of or include a silicon layer, a silicon germanium layer, or a combination thereof.

The capacitor C may be coupled to the substrate 801 through a storage node contact 803. The storage node contact 803 may be made of or include a silicon-containing material or a metal-containing material. The storage node contact 803 may be made of or include polysilicon, a metal, a metal nitride, a metal silicide, or a combination thereof.

The neighboring capacitors C may be electrically disconnected by a second inter-layer dielectric layer 804. The second inter-layer dielectric layer 804 may be made of or include a low-k material. The second inter-layer dielectric layer 804 may be formed, for example, of one among silicon oxide, silicon nitride, or a low-k material including silicon carbon and boron.

A third inter-layer dielectric layer 808 may be formed over the second inter-layer dielectric layer 804 including the capacitor C. The third inter-layer dielectric layer 808 may be made of or include a low-k material. The third inter-layer dielectric layer 808 may be formed, for example, of one among silicon oxide, silicon nitride, or a low-k material including silicon carbon and boron.

A first cell metal interconnection 812 that is coupled to the upper electrode 807 of the capacitor through the first cell contact 810 may be formed over the third inter-layer dielectric layer 808 of the cell region. A first peripheral metal interconnection 811 that is coupled to the substrate 801 of the peripheral region through the first peripheral contact 809 may be formed over the third inter-layer dielectric layer 808 of the peripheral region. The first cell metal interconnection 812 and the first peripheral metal interconnection 811 may be simultaneously or sequentially formed on the same plane.

A fourth inter-layer dielectric layer 813 may be formed over the third inter-layer dielectric layer 808, the first cell metal interconnection 812, and the first peripheral metal interconnection 811. The second cell contact 815 penetrating through the fourth inter-layer dielectric layer 813, and the second cell metal interconnection 817 and the second peripheral metal interconnection 816 that are coupled to the first cell metal interconnection 812 and the first peripheral metal interconnection 811, respectively, through the second cell contact 815 and the peripheral contact 814, respectively, may be formed over the fourth inter-layer dielectric layer 813. Herein, among the contacts respectively in contact with metal interconnections, the upward contact may contact the outer end of each metal interconnection, and the downward contact may contact the inner end of each metal interconnection. In other words, the first and second cell contacts 810 and 815 may be positioned spaced apart from each other in the horizontal direction while not overlapping with each other. Also, the first and second peripheral contacts 809 and 814 may also be positioned spaced apart by a predetermined distance in the horizontal direction while not overlapping with each other.

The first and second cell metal interconnections 812 and 817 and the first and second peripheral metal interconnections 811 and 816 may be or include a metal material. The first and second cell metal interconnections 812 and 817 and the first and second peripheral metal interconnections 811 and 816 may be or include a suitable metal, such as, for example, tungsten, copper, aluminum, or any combination thereof. The first and second cell contacts 810 and 815 and the second peripheral contacts 809 and 814 may be made of or include a silicon-containing material or a metal-containing material. The first and second cell contacts 810 and 815 and the second peripheral contacts 809 and 814 may be made of or include polysilicon, a metal, a metal nitride, a metal silicide, or a combination thereof.

At least one among the first and second cell metal interconnections 812 and 817, and the first and second peripheral metal interconnections 811 and 816 may have a spiral structure. According to another embodiment of the present invention, at least a lowest metal interconnection among the first and second cell metal interconnections 812 and 817 and the first and second peripheral metal interconnections 811 and 816 may have a spiral structure. According to another embodiment of the present invention, the first and second cell metal interconnections 812 and 817 and the first and second peripheral metal interconnections 811 and 816 may all be spiral structures.

Herein, the spiral structure may have a round shape, such as a circuit shape or an elliptical shape. According to another embodiment of the present invention, the spiral structure may have a polygon shape including a square, a rectangle, an octagon, and the like. The spiral structure may be formed in a continuous serial form or in a continuous parallel form as illustrated in FIG. 4A or 4B. According to another embodiment of the present invention, the spiral structure may be formed discontinuously as illustrated in FIG. 4C.

According to another embodiment of the present invention, although the multi-level cell metal interconnections 812 and 817 and the multi-level peripheral metal interconnections 811 and 816 are formed in two layers, the concept and spirit of the present invention are not limited thereto. The layers may have a multi-level structure of two or more layers. According to another embodiment of the present invention, although the multi-level cell metal interconnections 812 and 817 and the multi-level peripheral metal interconnections 811 and 816 are formed through a line etching process, the concept and spirit of the present invention are not limited thereto, and the metal interconnections may also be formed through the damascene process illustrated in FIGS. 7A to 7G or the dual damascene process illustrated in FIGS. 8A to 8F.

A fifth inter-layer dielectric layer 818 may be formed over the second cell metal interconnection 817 and the second peripheral metal interconnection 816. The fifth inter-layer dielectric layer 818 may be a passivation layer for protecting the underlying structures.

A cell pad 822 and a peripheral pad 821 may be formed over the fifth inter-layer dielectric layer 818 to be coupled to the second cell metal interconnection 817 and the second peripheral metal interconnection 816 through the third cell contact 820 and the third peripheral contact 819, respectively. The cell pad 822 and the peripheral pad 821 may be bonding pads. Although not illustrated, bumps may be formed over the cell pad 822 and the peripheral pad 821.

The third cell contact 820 and the third peripheral contact 819 may be made of or include a silicon-containing material or a metal-containing material. The third cell contact 820 and the third peripheral contact 819 may be made of or include polysilicon, a metal, a metal nitride, a metal silicide, or a combination thereof.

According to the embodiments of the present invention, the reliability of the semiconductor device may be improved by applying a metal interconnection having a spiral structure and reducing the plasma induced damage.

According to the embodiments of the present invention, the plasma induced damage generated from other metal interconnections or pads may be mitigated by applying a spiral metal interconnection having a spiral structure as at least one metal interconnection among multi-level metal interconnections.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a substrate;
   a test transistor over the substrate; and
   multi-level metal interconnections formed over the substrate and spaced apart from each other and from the test transistor in a vertical direction from the substrate; and
   contacts for connecting the metal interconnections,
   wherein at least one metal interconnection among the multi-level metal interconnections is a spiral metal interconnection, and
   wherein the contacts do not overlap with each other,
   wherein at least the lowest-level metal interconnection among the multi-level metal interconnections is a spiral metal interconnection.

2. The semiconductor device of claim 1, wherein the spiral metal interconnection has a current flow that offsets plasma-induced damage occurring from other metal interconnections among the multi-level metal interconnections.

3. The semiconductor device of claim 1,
   wherein an upward contact of each metal interconnection is coupled to a first end of each metal interconnection, and a downward contact of each metal interconnection is coupled to a second end of each metal interconnection.

4. The semiconductor device of claim 3, wherein the upward contact and the downward contact do not overlap with each other.

5. The semiconductor device of claim 1, wherein the multi-level metal interconnections are spiral metal interconnections.

6. The semiconductor device of claim 1, wherein a spiral structure of the at least one metal interconnection has a round shape or a bend shape.

7. The semiconductor device of claim 6, wherein the round shape includes a circular shape or an elliptical shape, and wherein the bend shape includes one shape selected from among polygonal structures including a rectangle, a square, and an octagon.

8. The semiconductor device of claim 1, wherein the multi-level metal interconnections are positioned at a higher level than the test transistor.

9. The semiconductor device of claim 1, wherein the test transistor includes a gate structure over the substrate, and source/drain regions formed in the substrate on both sides of the gate structure, and wherein the multi-level metal interconnections are coupled to one of the source/drain regions.

10. A semiconductor device, comprising:

a substrate including a cell region and a peripheral region;

an inter-layer dielectric layer formed over the substrate;

a capacitor formed over the inter-layer dielectric layer in the cell region and including a stacked structure of a lower electrode, a dielectric layer, and an upper electrode;

a storage node contact penetrating the inter-layer dielectric layer and connecting the capacitor and the substrate in the cell region;

multi-level cell metal interconnections formed over the capacitor of the cell region, and multi-level peripheral metal interconnections formed over the substrate of the peripheral region; and a cell pad formed over the multi-level cell metal interconnections, and a peripheral pad formed over the multi-level peripheral metal interconnections, wherein at least one metal interconnection among the multi-level cell metal interconnections and the peripheral metal interconnections is a spiral metal interconnection.

11. The semiconductor device of claim 10, wherein at least one lowest-level metal interconnection among the multi-level cell metal interconnections and the multi-level peripheral metal interconnections is a spiral metal interconnection.

12. The semiconductor device of claim 10, wherein the multi-level cell metal interconnections and the multi-level peripheral metal interconnections are spiral metal interconnections.

13. The semiconductor device of claim 10, wherein the spiral structure has a round shape or a bend shape.

14. The semiconductor device of claim 13, wherein the round shape includes a circular shape or an elliptical shape, and wherein the bend shape includes one shape selected from among polygonal structures including a rectangle, a square, and an octagon.

* * * * *